United States Patent [19]
Raghavan et al.

[11] Patent Number: 5,812,020
[45] Date of Patent: Sep. 22, 1998

[54] POSITIVE CURRENT SOURCE

[75] Inventors: Gopal Raghavan, Canoga Park; Joseph F. Jensen, Malibu; Albert E. Cosand, Agoura Hills, all of Calif.

[73] Assignee: Hughes Electronics Corporation, El Segundo, Calif.

[21] Appl. No.: 862,501

[22] Filed: May 23, 1997

Related U.S. Application Data

[62] Division of Ser. No. 588,665, Jan. 17, 1996, Pat. No. 5,726,600.

[51] Int. Cl.$^6$ .......................................................... G05F 3/04
[52] U.S. Cl. .......................... 327/543; 327/530; 327/538; 327/103; 323/312
[58] Field of Search ..................................... 327/562, 563, 327/103, 560, 538, 530, 543; 380/257, 258; 323/312, 315

[56] References Cited

U.S. PATENT DOCUMENTS

| | | | |
|---|---|---|---|
| 4,857,928 | 8/1989 | Gailus et al. | 341/143 |
| 5,157,350 | 10/1992 | Rubens | 330/257 |
| 5,315,231 | 5/1994 | Linder et al. | 327/530 |
| 5,371,475 | 12/1994 | Brown | 330/254 |
| 5,491,447 | 2/1996 | Goetschel | 330/254 |
| 5,614,864 | 3/1997 | Stubbe et al. | 327/258 |

OTHER PUBLICATIONS

Heij et al., "Transconductor and Integrator Circuits for Integrated Bipolar Video Frequency Filters", *Proceedings of ISCAS*, 1989, pp. 114–117.

Voorman et al., "Integration of Analog Filters in a Bipolar Process", *IEEE Journal of Solid State Circuits*, vol. SC–17, No. 4, Aug. 1982, pp. 713–722.

Veirman et al., "Design of a Bipolar 10–MHz Programmable Continuous–Time 0.05° Equiripple Linear Phase Filter", *IEEE Journal of Solid–State Circuits*, vol. 27, No. 3, Mar. 1992, pp. 324–331.

Sansen et al., "Distortion in Bipolar Transistor Variable–Gain Amplifiers", *IEEE Journal of Solid–State Circuits*, vol. SC–8, No. 4, Aug. 1973, pp. 275–282.

Singor et al., "Switched–Capacitor Bandpass Delta–Sigma A/D Modulation at 10.7 MHz", *IEEE Journal of Solid–State Circuits*, vol. 30, No. 3, Mar. 1995, pp. 184–192.

De Heij W. J.A., et al. "Accurate Automatic Tuning Circuit For Bipolar Integrated Filters" 1990 *IEEE International Symposium on circuits and Systems* vol. 2 of 4, May 1–3, 1990.

Klumperink, E, et al. "CMOS Variable Transconductance Circuit With Constant Bandwidth" Electronic Letters, vol. 25, No. 10, May 11, 1989, pp. 675–676.

Gray, P., et al. "Analysis and Design of Analog Integrated Circuits" Sec. Ed., Wiley & Sons pp. 201–211 (1984).

*Primary Examiner*—Timothy P. Callahan
*Assistant Examiner*—Dinh Le
*Attorney, Agent, or Firm*—V. D. Duraiswamy; W. K. Denson-Low

[57] ABSTRACT

A positive current source (PCS) for supplying common mode current. The PCS includes a pair of unity gain inverting single ended amplifiers that are connected in antiparallel across a pair of matched resistors. Alternately, the resistors can be connected across the inverting and non-inverting sides of a differential amplifier. A constant voltage is applied across the resistors to supply the common mode current ($I_{cm}$) while maintaining a common mode resistance of R/2 and a differential mode resistance approaching infinity. The PCS has a common mode resistance which is small enough to maintain a stable common mode operating point with process variations providing minimal impact.

3 Claims, 4 Drawing Sheets

POSITIVE CURRENT SOURCE

This is a division of application Ser. No. 08/588,665 filed Jan. 17, 1996 U.S. Pat. No. 5,726,600.

BACKGROUND OF THE INVENTION

1. Field of the Invention

This invention relates to high performance active filters and more specifically to a dynamically tunable transconductance cell and a positive current source implemented in an all NPN bipolar architecture.

2. Description of the Related Art

Tunable Gm cells are used to compensate for variations in active filter components where low bandwidth and low quality factor are not an issue. Heij et al, "Transconductor and Integrator Circuits for Integrated Bipolar Video Frequency Filters," Proceeding of ISCAS, 1989, pp. 114–117, disclose two matched resistors R1 connected in parallel around a variable transconductance cell, which includes a standard Gm cell whose transconductance $G_T$ is current dependent. The matched resistors preferably have a very high resistance so that the Gm cell's differential mode impedance is also very high. Thus, all of the differential signal current is used to charge the integrating capacitors and does not leak significantly through the resistors. However, the high resistance also produces a high common mode impedance such that any variations in the common mode input signal are amplified. This reduces the tuning bandwidth to approximately 20% around the center resonant frequency. The total variable transconductance is:

$$G = \frac{1}{R_1} + G_Y \qquad (1)$$

where $|G_T|<0.2/R_1$. As a result, the transconductance G is strictly positive. Furthermore, the large series resistance lowers the Gm cell's, and hence, the modulator's quality factor.

Voorman et al, "Integration of Analog Filters in a Bipolar Process," IEEE Journal of Solid State Circuits, vol. SC-17, pp. 713–722, Aug. 1982 discloses a tunable Gm cell that uses conventional current multipliers to vary the cell's transconductance by a tuning factor α. However, the common mode current is varied by the same factor α, which limits the tuning bandwidth to 10–15% of the resonant frequency. Furthermore, α cannot be set to zero, and hence the Gm cell is limited to strictly positive transconductances.

To improve distortion and increase speed, known fixed and tunable Gm cells are often implemented with all NPN bipolar transistors. As a result, the Gm cell only sinks current. It thus becomes necessary to provide a positive current source (PCS) that supplies a common mode current, which is then modulated by the input signal. One approach is to tie a resistor to a positive supply voltage to provide the common mode current. This approach has the same drawbacks as Heij's tunable Gm cell. A second approach is to use PNP, PMOS or P-JFET transistors to supply the common mode current. This provides high common mode resistance, which requires common mode feedback to compensate the circuit and lower the resistance. The PNP transistors in a convention bipolar process and the common mode feedback are very slow. Processes with fast transistors of both polarities are more complex and, thus more expensive. Another approach is to use a negative resistance cell as disclosed by Veirman et al, "Design of a Bipolar 10 Mhz Programmable Continuous Time 0.05° Equiripple Linear Phase Filter," IEEE Journal of Solid-State Circuits, vol. SC-27, pp. 324–331, March 1992. The cell's common mode resistance is a fixed resistance R and its differential mode resistance is theoretically infinite. However, the cell's resistance must be matched exactly to achieve a very high differential mode resistance.

SUMMARY OF THE INVENTION

In view of the above problems, the present invention provides a tunable transconductance cell that provides variable transconductance while maintaining a constant common mode current and provides a positive current source that supplies $I_{cm}$, while maintaining a common mode resistance of R/2 and a theoretically infinite differential mode resistance.

The tunable Gm cell includes a fixed Gm cell having transconductance $G_f$. A current divider and recombination circuit together effectively multiply $G_f$ by a tuning factor α, where $-1 \leq \alpha \leq 1$, without affecting the cell's common mode current $I_{cm}$. A positive current source includes a pair of unity gain inverting amplifiers that are connected in antiparallel across a pair of matched resistors. Alternately, the same pair of resistors can be connected across the inverting and non-inverting sides of a differential amplifier. A constant voltage is applied across the resistors to supply $I_{cm}$, while maintaining a common mode resistance of R/2 and a differential mode resistance approaching infinity. As a result, the cell's transconductance can be varied over a wide range while maintaining a stable common mode operating point and a high quality factor.

These and other features and advantages of the invention will be apparent to those skilled in the art from the following detailed description of preferred embodiments, taken together with the accompanying drawings, in which:

DETAILED DESCRIPTION OF THE INVENTION

The present invention provides component circuitry for an active filter. The circuitry includes an all NPN bipolar dynamically tunable transconductance (Gm) cell and a positive current source (PCS) that supplies the common mode current $I_{cm}$. The Gm cell's transconductance $G_T$ can be varied by controlling a tuning factor α without affecting the common mode current $I_{cm}$. The preferred PCS is implemented with only NPN transistors and has a common mode resistance of R/2 and a theoretically infinite differential mode resistance. In practice the differential mode resistance can be several orders of magnitude larger than the common mode resistance. The tunable Gm cell and PCS can be used in active filters such as ADCs, digital-to-analog converters (DACs), signal detectors, and pulse code modulators. The all NPN bipolar architectures provide approximately two orders of magnitude improvement in bandwidth, approximately an order of magnitude increase in quality factor over known architectures, and a stable common mode operating point.

Figure 1:
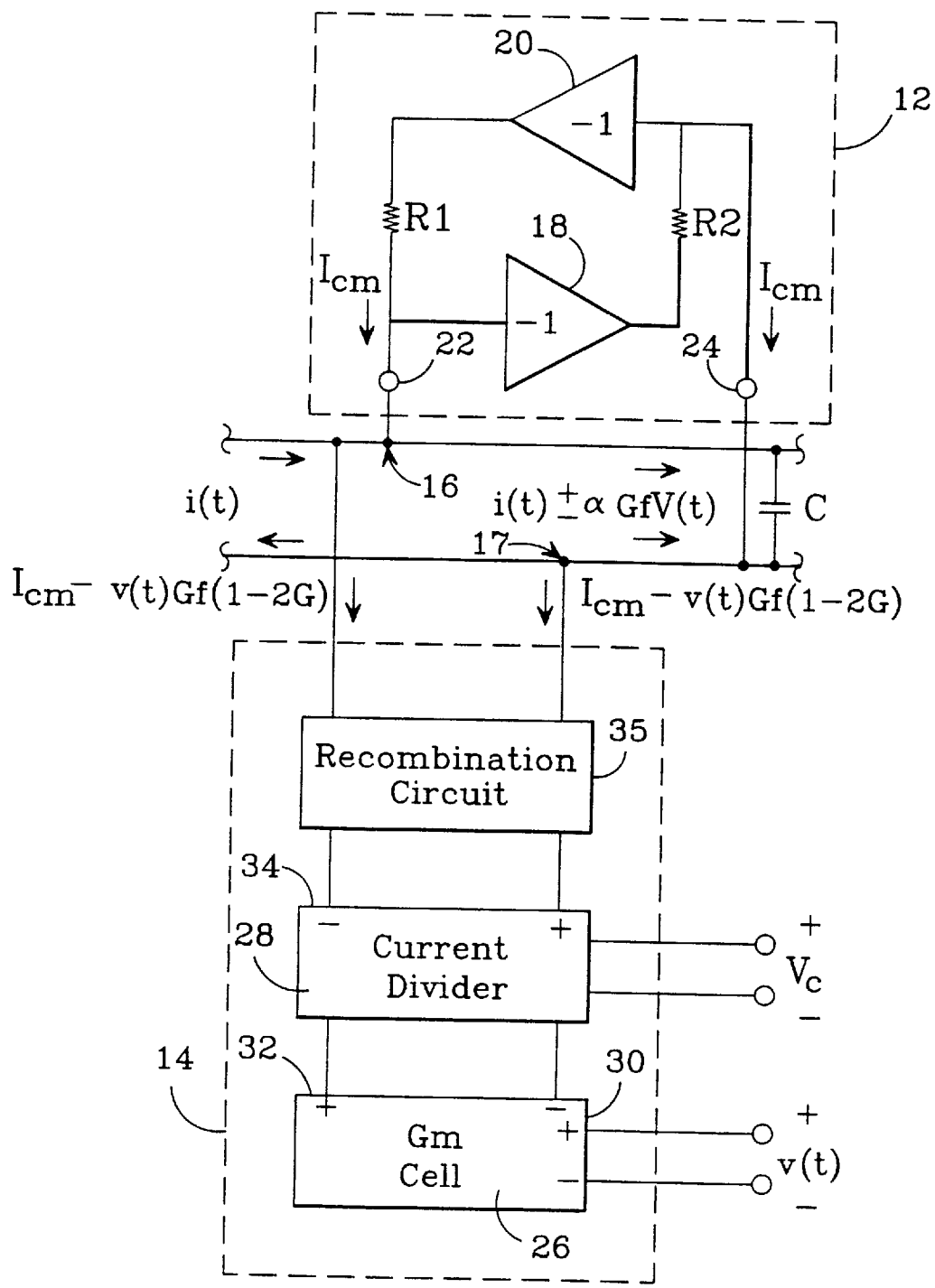
FIG. 1 is a block diagram of a portion of an active filter including a tunable Gm cell and a PCS that employ the invention.

FIG. 1 shows a portion of an active filter in which a PCS 12 and a tunable Gm cell 14 are connected differentially to a pair of current summing nodes 16 and 17. The PCS supplies a pair of common mode currents $I_{cm}$, which are differentially modulated by the Gm cell 14. The PCS 12 has a small common mode impedance of R/2 such that a change in the common mode component of the input current i(t) induces only a small change in the common mode voltages at summing nodes 16 and 17. Thus, the active filter maintains a stable common mode operating point. Furthermore, the PCS has a very large differential mode impedance, theoretically infinite, such that substantially all of the differential signal current is driven into an integration capacitor C. The tunable Gm cell differentially modulates the common mode currents $I_{cm}$ by $\pm \alpha G_f v(t)$ where $|\alpha| \leq 1$, $G_f$ is a fixed transconductance and v(t) is a voltage signal, while maintaining a common mode current $I_{cm}$ that is independent of $\alpha$. This allows the cell's transconductance, and hence the filter's resonant frequency to be varied over a wide range while maintaining a high quality factor.

The PCS 12 includes a pair of unity gain inverting amplifiers 18 and 20 that are connected in anti-parallel across a pair of matched resistors R1 and R2 having resistance $R_0$. A constant voltage V1 is applied across the resistors R1 and R2 to supply the common mode currents $I_{cm}$ at output terminals 22 and 24, which route the current to summing nodes 16 and 17, respectively. A change in the common mode voltage $\Delta v$ at output terminals 22 and 24 produces a voltage change across the resistors of $2\Delta v$. Thus, the PCS has a common mode impedance of $R_0/2$, which is small enough to maintain a stable common mode operating point with process variations providing minimal impact. A change in the differential mode voltage of $+\Delta v$ at terminal 22 and of $-\Delta v$ at terminal 24 does not affect the voltage across resistors R1 and R2. Thus, the PCS has an ideal differential mode impedance of infinity. In practice, the differential mode impedance can be several orders of magnitude larger than the common mode impedance, which allows us to maintain a high Q.

The tunable Gm cell 14 includes a fixed Gm cell 26 that has transconductance $G_f$. The application of a differential voltage signal v(t) to the Gm cell's differential input 30 produces a differential mode current signal $\pm v(t)G_f$ that is imposed on the common mode current signals $I_{cm}$ at its differential output 32. A current divider 28 varies the cell's transconductance by splitting the current signals into two pair of branches and routing the current from one branch in each pair to the current divider's differential output 34. The apportionment of current between the two branches, and hence $\alpha$, is set by a control voltage $V_c$. At this point, both the common mode and differential mode signals are a function of $\alpha$. To remove the common mode signal's dependency on $\alpha$, the portion of the common mode signal that was removed by the current divider is added back into the signal path by a recombination circuit 35 so that the differential mode current signals $\pm v(t)G_f$ are scaled by $\alpha$ and the common mode current signals $I_{cm}$ are independent of $\alpha$.

The recombination circuit 35 is preferably implemented (as shown in detail in FIG. 3) by cross-coupling the second branches in each pair to the differential output 34. This both removes the $\alpha$ dependency and doubles the effect of splitting the current, which allows $\alpha$ to range from +1 to −1.

Alternately, the same effect can be accomplished by providing another Gm cell and current divider that are driven by the same voltage signal v(t) and control voltage Vc and cross-coupling that current divider's second branches to the differential output 34. However, this requires twice the number of components and may not completely eliminate the common mode signal's dependence on $\alpha$ if there is any mismatch between the components. In the alternate embodiment, the second Gm cell can be eliminated with the only effect being that $\alpha$ is constrained to lie between 0 and +1.

Figure 2:
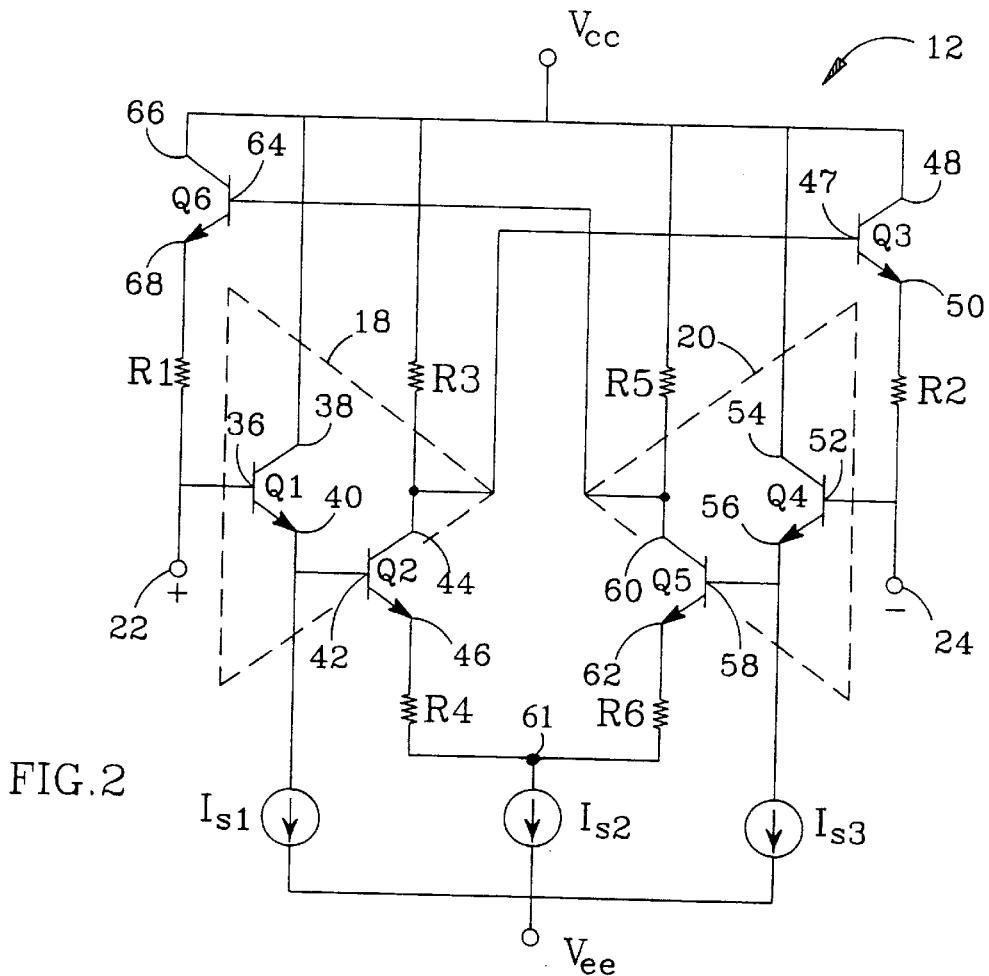
FIG. 2 is a schematic diagram of a preferred positive current source shown in FIG. 1.
Figure 6:
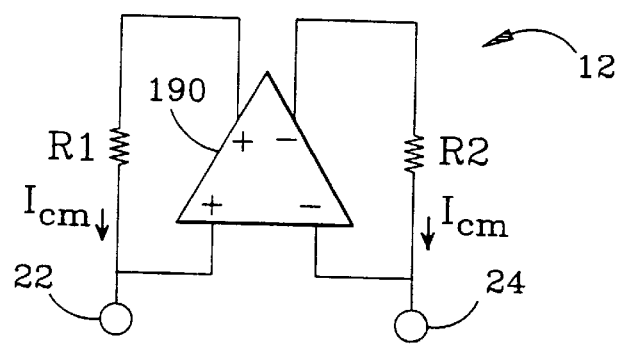
FIG. 6 is a schematic diagram of an equivalent differential circuit representation of the PCS shown in FIG. 1.

FIG. 2 illustrates an NPN circuit topology for the PCS 12 shown in FIG. 1, and shown in an equivalent differential circuit representation in FIG. 6. The inverting single-ended amplifier 18 includes NPN transistors Q1 and Q2, which are connected as an emitter follower and a degenerated common-emitter inverting amplifier, respectively. Transistor Q1's base 36 is connected at output terminal 22, its collector 38 is tied to a high supply voltage Vcc, and its emitter 40 is connected to a current source Is1. Transistor Q2's base 42 is connected to emitter 40, its collector 44 is connected to a resistor R3, and its emitter 46 is connected to a resistor R4. The other side of resistor R3 is tied to the supply voltage Vcc and the other side of resistor R4 (which is at virtual ground) is connected through a current source Is2 to the low supply voltage Vee. The amplifier's output voltage is taken at transistor Q2's collector 44 and is applied to the base 47 of an emitter follower buffer transistor Q3. Q3's collector 48 is tied to the positive supply voltage Vcc and its emitter 50 is connected to resistor R2.

A voltage change of $+\Delta v$ at the base 36 of transistor Q1 increases the voltage across resistor R4. This increases the current flowing through resistors R3 and R4, which reduces the amplifier's output voltage at Q2's collector 44. This in turn reduces the voltage at Q3's emitter 50. The inverting amplifier 18 and level shifting transistor Q3 together must have unity gain to achieve infinite differential mode resistance. Ideally, the emitter follower transistors Q1 and Q3 and inverting amplifier transistor Q2 have unity gain. However, their gains are typically slightly less than 1. Thus, to achieve a high differential mode resistance, the resistance of R3 is set greater than the resistance of R4.

The unity gain inverting single-ended amplifier 20 is identical to amplifier 18 and includes NPN transistors Q4 and Q5, which are connected as an emitter follower and a degenerated common-emitter inverting amplifier, respectively. Transistor Q4's base 52 is connected at output terminal 24, its collector 54 is tied to the high supply voltage Vcc, and its emitter 56 is connected to a current source Is3. Transistor Q5's base 58 is connected to emitter 56, its collector 60 is connected to a resistor R5, and its emitter 62 is connected to a resistor R6. The other side of resistor R5 is tied to the supply voltage Vcc and the other side of resistor R6 (which is at virtual ground) is connected through the current source Is2 to the low supply voltage Vee. The amplifier's output voltage is taken at transistor Q5's collector 60 and is applied to the base 64 of an emitter follower buffer transistor Q6. Q6's collector 66 is tied to the positive supply voltage Vcc and its emitter 68 is connected to resistor R1. To achieve high differential mode resistance, the resistance of R5 is set greater than the resistance of R6.

As shown in FIG. 2, the two single-ended inverting amplifiers 18 and 20 are connected together, i.e. resistors R4 and R6 share the current source Is2, and thus form the differential amplifier 190 shown in FIG. 6. The differential configuration responds to changes in the voltage signal faster than two separate single-ended amplifiers, and thus provides better performance. The differential configuration also results in node 61 at the connection of resistors R4 and R6 being at virtual ground.

A change in the common mode voltage changes the voltages at the bases of transistors Q1 and Q4 by the same amount Δv. As a result, the voltage across resistors R1 and R2 changes by 2Δv so that the common mode impedance seen at output terminals 22 and 24 is $R_0/2$. A change in the differential mode voltage drives the voltages at the bases of transistors Q1 and Q2 in opposite directions by +Δv and −Δv, respectively. As a result, the voltage across the resistors R1 and R2 ideally does not change, and the differential mode impedance is infinite. In practice, the differential mode impedance is limited by the ability to set the amplifiers' gain to exactly unity.

Figure 3:
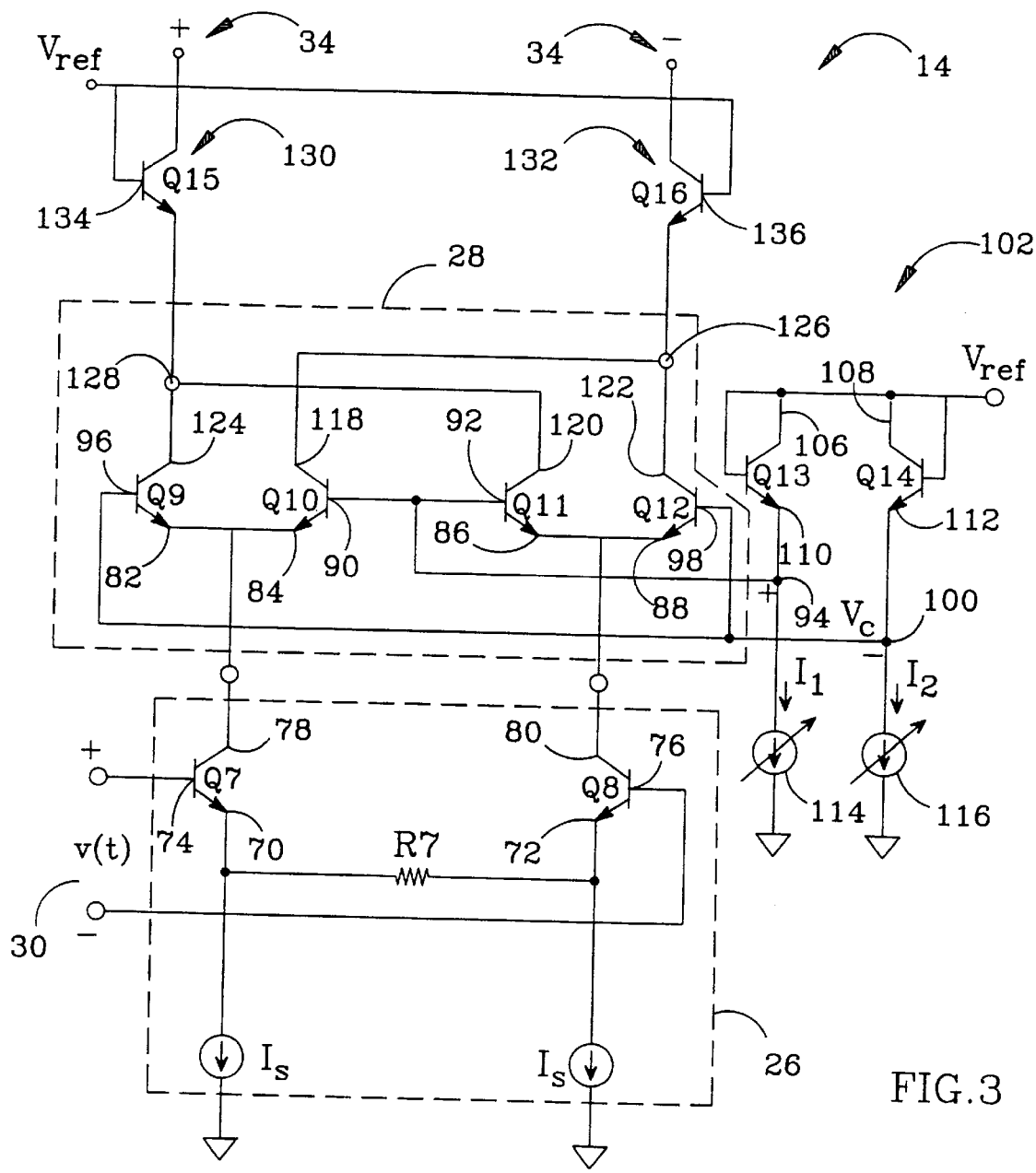
FIG. 3 is a schematic diagram of a preferred tunable Gm cell shown in FIG. 1.

As shown in FIG. 3, the tunable Gm cell 14 is preferably implemented in an all NPN bipolar architecture, which increases the cell's bandwidth. The Gm cell 26 includes a pair of transistors Q7 and Q8 whose emitters 70 and 72, respectively, are connected to opposite sides of a resistor R7 having a resistance 2R. A pair of biasing current sources Is are connected between the emitters 70 and 72, respectively, and a low supply voltage Vee. The current sources Is sink the common mode current $I_{cm}$ that flows through the transistors Q7 and Q8.

The voltage v(t) is applied differentially at the input 30 across the base contacts 74 and 76 of transistors Q7 and Q8, respectively. This produces a voltage v(t) across resistor R7 such that currents $I_{Q7}(t)=I_{cm}+v(t)/2R$ and $I_{Q8}(t)=I_{cm}-v(t)/2R$ flow through the collectors 78 and 80 of transistors Q7 and Q8, respectively. The transconductance $G_f$ of the cell 26 is approximately given by: $G_f=(I_{Q7}(t)-I_{Q8}(t))/v(t)=1/R$.

The current divider 28 comprises two pair of differentially connected NPN transistors Q9, Q10 and Q11, Q12. The emitters 82 and 84 of transistors Q9 and Q10 are connected and together supply the tail current $I_{cm}+v(t)/2R$ to the collector 78 of transistor Q7, and the emitter 86 and 88 of transistors Q11 and Q12 are connected and together supply the tail current $I_{cm}-v(t)/2R$ to the collector 80 of transistor Q8. The bases 90 and 92 of transistors Q10 and Q11 are connected to a positive voltage node 94, and the bases 96 and 98 of Q9 and Q12 are connected to a negative voltage node 100.

The control voltage Vc is applied differentially to the negative and positive nodes 100 and 94 to control the transistors' base-emitter voltages such that transistors Q10 and Q11 conduct G times their respective tail currents and transistors Q9 and Q12 conduct (1−G) times their respective tail currents where $0 \leq G \leq 1$. When Vc is large and positive G approaches 1 so that transistors Q10 and Q11 conduct substantially all of their respective tail currents. Conversely when Vc is large and negative G approaches 0 so that transistors Q9 and Q12 conduct substantially all of their respective tail currents. When Vc=0, G=½ and the transistors are balanced.

A current controlled circuit 102 generates the control voltage $V_c$ to select the value of G. The circuit 102 includes a pair of diode connected NPN transistors Q13 and Q14 whose respective base-collector junctions 106 and 108 are tied to a reference voltage Vref. Their emitters 110 and 112 are connected to the positive and negative voltage nodes 94 and 100, respectively. Variable current sources 114 and 116 supply currents I1 and I2 that flow through transistors Q13 and Q14, respectively, so that the control voltage $V_c$ is given by:

$$V_c = V_t \ln\left(\frac{I2}{I1}\right) \quad (2)$$

The splitting fraction G varies between 0 and 1 in response to the control voltage Vc according to the following relation:

$$G = \frac{e^{V_c/V_t}}{1+e^{V_c/V_t}} \quad (3)$$

Substituting the representation for $V_c$ in equation 2 into equation 3 gives:

$$G = \frac{I2}{I1+I2} \quad (4)$$

Thus, the tuning factor G can be easily and accurately controlled by varying the supply currents I1 and I2.

To remove the common mode currents dependency on α and implement the recombination circuit 35 as shown in FIG. 1, the collectors 118 and 120 of transistors Q10 and Q11 are cross-coupled to the collectors 122 and 124 of transistors Q12 and Q9 at current summing nodes 126 and 128, respectively. The current flowing into node 128 is (1−G) ($I_{cm}$+v(t)/2R)+G($I_{cm}$−v(t)/2R, which equals $I_{cm}$+(v(t)/2R) (1−2G). Similarly the current flowing into node 126 is $I_{cm}$−(v(t)/2R) (1−2G).

The output impedance of the Gm cell 14 looking into nodes 126 and 128 is the parallel combination of the resistances of transistors Q10 and Q12, and of the transistors Q9 and Q11, respectively. To increase the cell's output impedance, a pair of cascode transistors Q15 and Q16 are connected such that their collector-emitter circuits 130 and 132 conduct current from nodes 128 and 126, respectively, to the cell's differential output 34. Their bases 134 and 136 are connected to the reference voltage Vref. Thus, the output impedance looking into the differential outputs 34 is the resistance of transistors Q15 and Q16.

The transconductance $G_T$ of the tunable Gm cell 14 is the differential output current divided by the input voltage signal, and is given by:

$$G_T = \frac{1}{R}(1-2G) \quad (5)$$

where 1/R is the fixed transconductance $G_f$ of Gm cell 26 and (1−2G) is the factor α. Thus, the tunable transconductance $G_T$ is given by:

$$G_T = \alpha G_f \quad (6)$$

As a result, the transconductance $G_T$ can be accurately varied from $-G_f$ to $+G_f$ to select the desired noise filter, tune the resonant frequency to compensate for processing variations, and to track fluctuations in the input signal's center frequency, while maintaining a high differential mode impedance. Furthermore, the common mode current $I_{cm}$ that flows into the Gm cell 14 is independent of the tuning factor α. Thus, the resonant cell's resonant frequency can be tuned over a wide bandwidth.

Figure 4:
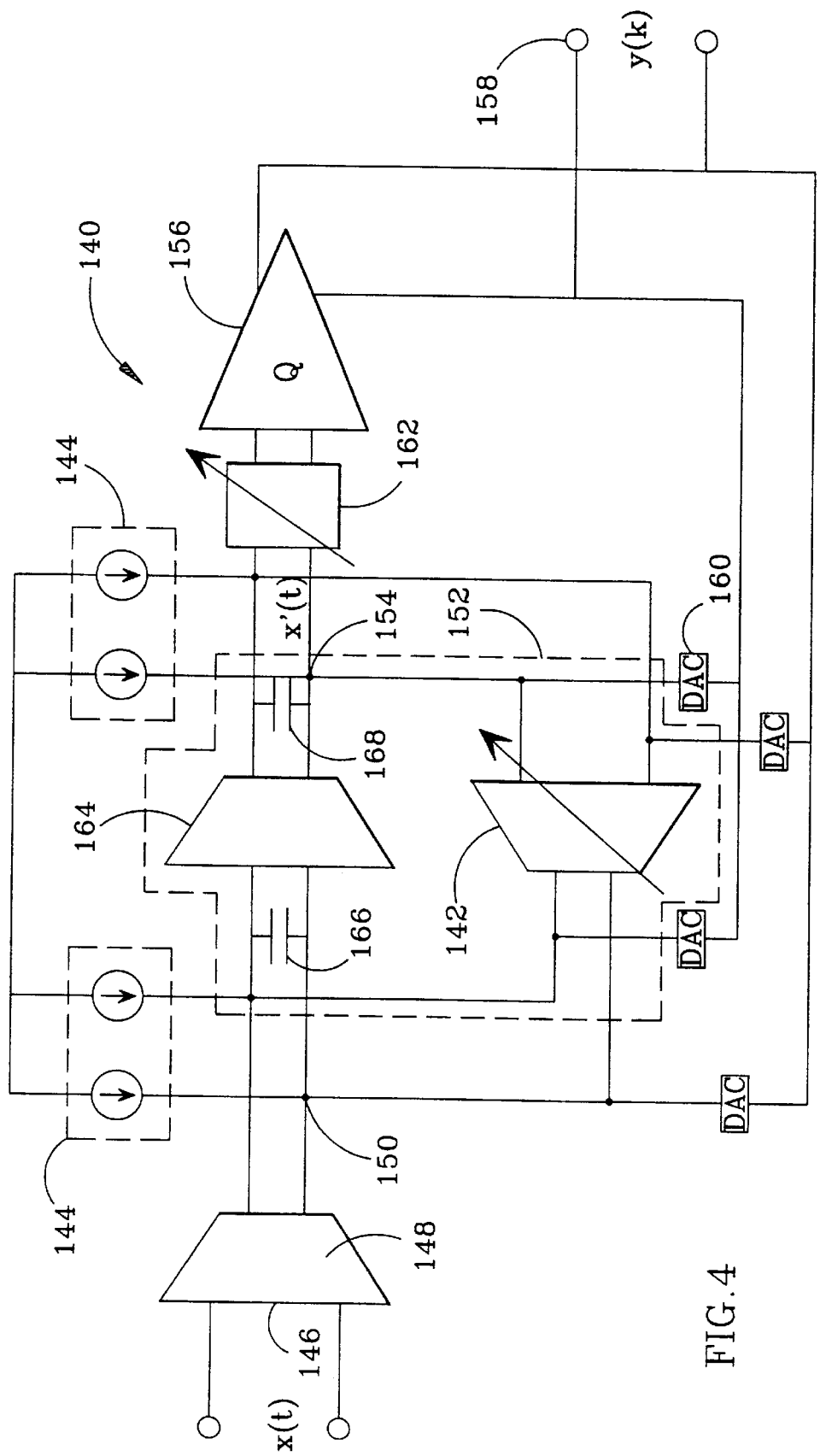
FIG. 4 is a schematic diagram of an active filter that incorporates the tunable Gm cell and the PCS shown in FIGS. 3 and 2, respectively.

FIG. 4 shows an active filter, specifically a second order continuous-time dynamically tunable ΔΣ modulator 140, that is implemented with a tunable Gm cell 142 and a pair of PCSs 144. A time varying differential analog voltage signal x(t), which can be modulated about a single carrier frequency $f_c$, multiple carrier frequencies or not modulated, i.e. a single side band (SSB) system, is applied to the differential input 146 of a Gm cell 148. The cell 146 converts the signal into a differential analog current signal at a first pair of current summing nodes 150. The current signal is driven into a tunable resonator 152, which integrates and converts the current into a differential analog voltage signal x'(t) across a second pair of current summing nodes 154. The pair of positive current sources 144 each supply a pair of common mode currents at the first and second pairs of current summing nodes 150 and 154, respectively.

A low bit quantizer 156 oversamples x'(t) and outputs a digital voltage signal y(k) at a pair of output terminals 158. The quantizer 156, preferably a 1-bit comparator, samples x'(t) at a frequency of $kf_s$, where $f_s$ is the Nyquist rate and k is the oversampling ratio, typically between 4× and 128×. The output voltage y(k) is converted into an analog current level and negatively fed back to the first and second summing nodes, where it is held until the next clock cycle. The conversion is preferably accomplished using two 1-bit current steering DACs 160, which accurately generate reproducible binary current levels. A variable delay 162 is connected between the resonator 152 and the quantizer 156 to add a negative phase delay to offset the positive phase delay induced by the quantizer 156 and stabilize the feedback path.

The tunable resonator 152 includes a fixed Gm cell 164 having transconductance G1 and the tunable Gm cell 142 having variable transconductance $G_T=\alpha G_f$, where $G_f$ is the transconductance of a fixed Gm cell, with the cells 142 and 164 connected in anti-parallel. The fixed Gm cell's differential input and differential output are connected to the first and second pairs of current summing nodes 150 and 164, respectively. The tunable Gm cell's differential input and differential output are connected to the second and first pairs of current summing nodes 154 and 150, respectively, in a negative feedback configuration. A capacitor 166 having capacitance C1 is connected across the first pair of current summing nodes 150 to integrate their differential current and produce a voltage across the differential input to drive the fixed Gm cell 164. A capacitor 168 having capacitance C2 is connected across the second pair of current summing nodes 154 to integrate their differential current and produce the voltage x'(t) that is input to the variable delay 162. In this configuration, the resonator 152 has a frequency response:

$$H(s) = \frac{s}{s^2 + \omega_0^2} \quad (6)$$

where the resonant frequency is equal to $\omega_0=[(G1G_T)/(C1C2)]^{0.5}$. The resonator's resonant frequency is varied from DC to approximately 1 Ghz by varying $G_T$ from 0 to $+G_f$.

The ΔΣ modulator 140 has an output spectrum Y(s) given by:

$$Y(s) = \frac{X(s)}{s^2 + as + b} + \frac{Q(s)(s^2 + \omega_0^2)}{s^2 + as + b} \quad (7)$$

where X(s) is the spectrum of the input signal x(t) and Q(s) is the quantization noise spectrum. The input spectrum X(s) occupies a known portion of the available bandwidth about a center frequency. Outside that bandwidth the amplitude of the input spectrum X(s) is reduced to approximately zero. The quantization noise spectrum Q(s) is distributed approximately uniformly from DC to $kf_s$. The coefficients a and b are time varying functions of the capacitances C1 and C2 and transconductances G1 and $G_T$. They result from the nonlinearity of the quantizer, but are not significant in the analysis of the modulator.

As indicated in equation 7, the quantization noise spectrum Q(s) is shaped by a band-stop filter so that the output noise spectrum $$N(s) = \frac{Q(s)(s^2 + \omega_0^2)}{s^2 + as + b}$$

has a zero at the resonant frequency $\omega_0$. The tunable Gm cell is tuned to position the resonant frequency $\omega_0$, and hence the zero in the noise spectrum N(s), to minimize the quantization noise that occurs in the signal bandwidth portion of the output spectrum Y(s). In a BPF configuration, the resonant frequency is preferably tuned so that it matches the center frequency of the input spectrum X(s). If the Gm cell 142 is tuned so that its transconductance $G_T=0$, the frequency response H(s) simplifies to 1/s, which is the response of an integrator. In a LPF configuration, the resonant frequency may be offset from DC to optimize the SNR.

Because the tunable Gm cell maintains a constant common mode current, its transconductance and hence the modulator's resonant frequency can be varied over a wide range to implement both LPFs and BPFs while maintaining a high quality factor. The PCS presents a high, ideally infinite, differential mode impedance which limits the amount of the differential mode current that leaks through the PCS. Furthermore, the PCS has a low, R/2, common mode impedance such that any variations in the common mode input signal are not amplified. Thus, the active filter maintains a stable common mode operating point.

Figure 5:
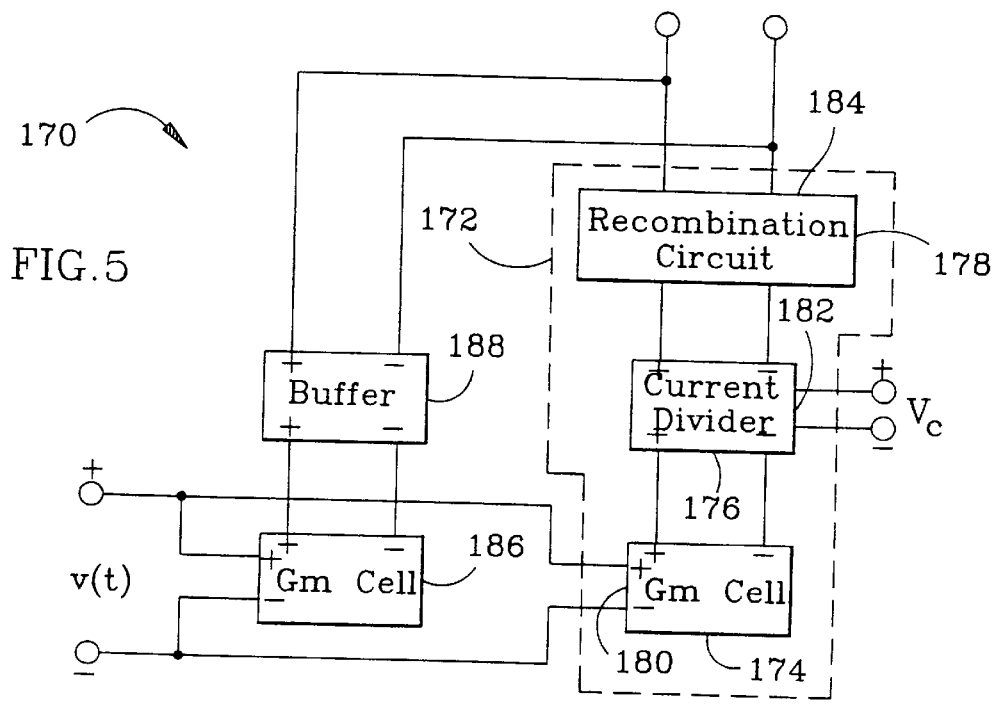
FIG. 5 is a block diagram of an alternate embodiment of a tunable Gm cell.

FIG. 5 illustrates an alternate tunable Gm cell 170 that has a limited transconductance range but which suppresses any non-idealities in the current divider. The Gm cell 170 includes a tunable Gm cell 172 of the type shown in FIG. 1. The Gm cell 172 includes a fixed Gm cell 174 having transconductance Gm1, a current divider 176 and a recombination circuit 178. The tunable Gm cell 172 responds to the application of a voltage signal v(t) at the fixed Gm cell's differential input 180 and a control voltage signal Vc at the current divider's input 182 to produce a variable transconductance ±Gm1 at the recombination circuit's differential output 184. The Gm cell 170 includes another fixed Gm cell 186 having transconductance Gm2 and a buffer 188 that are connected in series between the voltage signal v(t) and the recombination circuit's differential output 184. The buffer 188 is suitably a cascode pair of npn transistors that match the delay and output impedance of the current divider 176. As a result, the total transconductance seen at the differential output 184 is Gm2 ±Gm1. Because only a portion of the total output current passes through the current divider 176 and non-idealities are reduced. For example, if Gm1=Gm2=½$G_f$, the total transconductance will range from 0 to $G_f$ and only one-half of the total output current is subject to any noise and/or distortion in the current divider 176.

FIG. 6 shows an equivalent circuit representation for the PCS shown in FIG. 1. The PCS 12 includes a unity gain differential amplifier 190 whose non-inverting and inverting inputs are connected to output terminals 22 and 24, respectively. Implementing the PCS with a single differential amplifier as shown in FIG. 2 reduces its response time to changes in the common and differential mode voltages, which improves its performance. The resistors R2 and R3 are connected across the non-inverting and inverting sides of amplifier 190. A change in the common mode voltage Δv at output terminals 22 and 24 produces a voltage change across the resistors of 2Δv. Thus, the PCS has a common mode impedance of $R_0/2$, which is small enough to maintain a stable common mode operating point with process variations providing minimal impact. A change in the differential mode voltage of +Δv at terminal 22 and of −Δv at terminal 24 does not effect the voltage across resistors R2 and R3. Thus, the PCS has an ideal differential mode impedance of infinity. In practice, the differential mode impedance can be several orders of magnitude larger than the common mode impedance, which allows us to maintain a high Q.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. A positive current source (PCS), comprising first and second unity gain inverting single-ended amplifiers having respective inputs and outputs, a first resistor having resistance R that is connected between the input of said first amplifier and the output of said second amplifier, and a second resistor having resistance R that is connected between the input of said second amplifier and the output of said first amplifier to supply a pair of common mode currents through said resistors at a pair of output terminals that are connected to respective ones of a pair of summing nodes, said PCS's common mode impedance being approximately R/2 and its differential mode impedance approaching infinity.

2. The PCS of claim 1, wherein each single-ended amplifier comprises:

a supply voltage terminal;

a current source first and second NPN transistors having respective bases, collectors, and emitters, the base of said first transistor being connected to a first one of said resistors at the output node to which said first one of said resistors is connected, the collector of said first transistor being connected to said supply voltage terminal, and the emitter of said first transistor being connected to the current source and the base of said second transistor;

a collector resistor that is connected between the collector of said second transistor and the supply voltage terminal;

an emitter resistor that is connected between the emitter of said second transistor and the current source; and an emitter follower buffer transistor having a base that is connected to the collector of said second, a collector that is connected to the supply voltage terminal, and an emitter that is connected to a second one of said resistors on the side opposite its output terminal, the ratio of the resistance of the collector resistor to the resistance of the emitter resistor being such that each said single-ended amplifier has substantially unity gain.

3. The PCS of claim 2, wherein the emitter resistors of said single-ended amplifiers are connected together and share said current source such that said single-ended amplifiers together form a differential amplifier having inverting and non-inverting inputs connected to respective output terminals, where said emitter resistors are connected across the inverting and non-inverting inputs of said differential amplifier respectively.

* * * * *